(12) United States Patent
Sinnett et al.

(10) Patent No.: US 7,674,117 B2
(45) Date of Patent: Mar. 9, 2010

(54) STRAIN-RESISTANT ELECTRICAL CONNECTION

(75) Inventors: Jay C. Sinnett, Greenville, SC (US); Arthur R. Metcalf, Greenville, SC (US)

(73) Assignee: Michelin Recherche et Technique S.A., Granges-Paccot (CH)

( * ) Notice: Subject to any disclaimer, the term of this patent is extended or adjusted under 35 U.S.C. 154(b) by 497 days.

(21) Appl. No.: 10/827,593

(22) Filed: Apr. 19, 2004

(65) Prior Publication Data

US 2005/0230148 A1 Oct. 20, 2005

(51) Int. Cl.
*H01R 4/58* (2006.01)
(52) U.S. Cl. .................................... 439/86; 439/947
(58) Field of Classification Search ................ 439/86, 439/947; 174/250
See application file for complete search history.

(56) References Cited

U.S. PATENT DOCUMENTS

| | | | | | |
|---|---|---|---|---|---|
| 3,346,689 | A | * | 10/1967 | Parstorfer | 174/265 |
| 4,895,138 | A | * | 1/1990 | Yabe | 600/110 |
| 5,130,499 | A | * | 7/1992 | Dijkshoorn | 174/254 |
| 5,386,344 | A | * | 1/1995 | Beaman et al. | 361/785 |
| 5,831,214 | A | * | 11/1998 | Diehlmann et al. | 174/94 R |
| 6,268,561 | B1 | * | 7/2001 | Buscella | 174/549 |
| 6,431,904 | B1 | * | 8/2002 | Berelsman | 439/447 |
| 6,734,791 | B2 | | 5/2004 | Kelly et al. | |
| 6,797,891 | B1 | * | 9/2004 | Blair et al. | 174/268 |
| 6,969,806 | B2 | * | 11/2005 | Dupriest | 174/117 F |
| 7,102,499 | B2 | * | 9/2006 | Myatt | 340/447 |
| 2002/0027531 | A1 | * | 3/2002 | Brown et al. | 343/895 |
| 2004/0189456 | A1 | * | 9/2004 | Myatt | 340/445 |
| 2005/0230148 | A1 | * | 10/2005 | Sinnett et al. | 174/267 |

FOREIGN PATENT DOCUMENTS

| WO | WO 03105509 | 12/2003 |
|---|---|---|
| WO | WO 03105511 | 12/2003 |

OTHER PUBLICATIONS

U.S. Appl. No. 10/793,368, filed Mar. 4, 2004, Myatt.

* cited by examiner

*Primary Examiner*—James Harvey
(74) *Attorney, Agent, or Firm*—Dority & Manning, P.A.

(57) ABSTRACT

A strain-resistant electrical connection and a method of making the same is provided. A wire or other conductive lead is connected to a circuit in a manner that makes the connection more resistant to mechanical stresses such as movement or rotation of the lead relative to the circuit. A material is configured around the lead and near the point of connection to the circuit so as to create a region of decreasing flexibility or graduated stiffness near the point of connection. In certain embodiments, the lead may also be coiled or otherwise shaped to provide additional ability to withstand mechanical stresses.

15 Claims, 4 Drawing Sheets

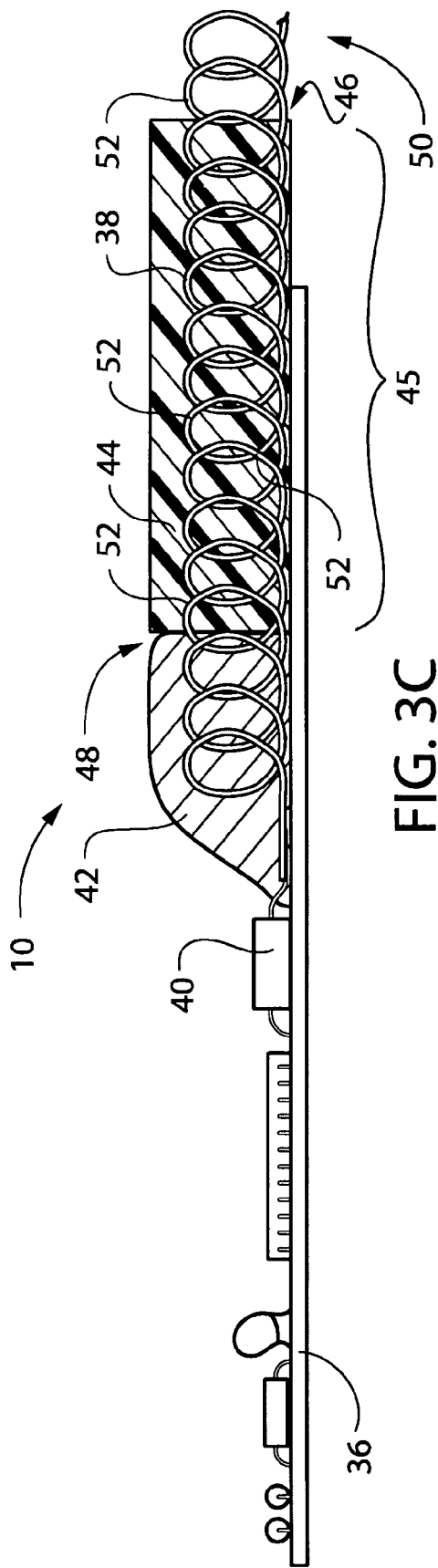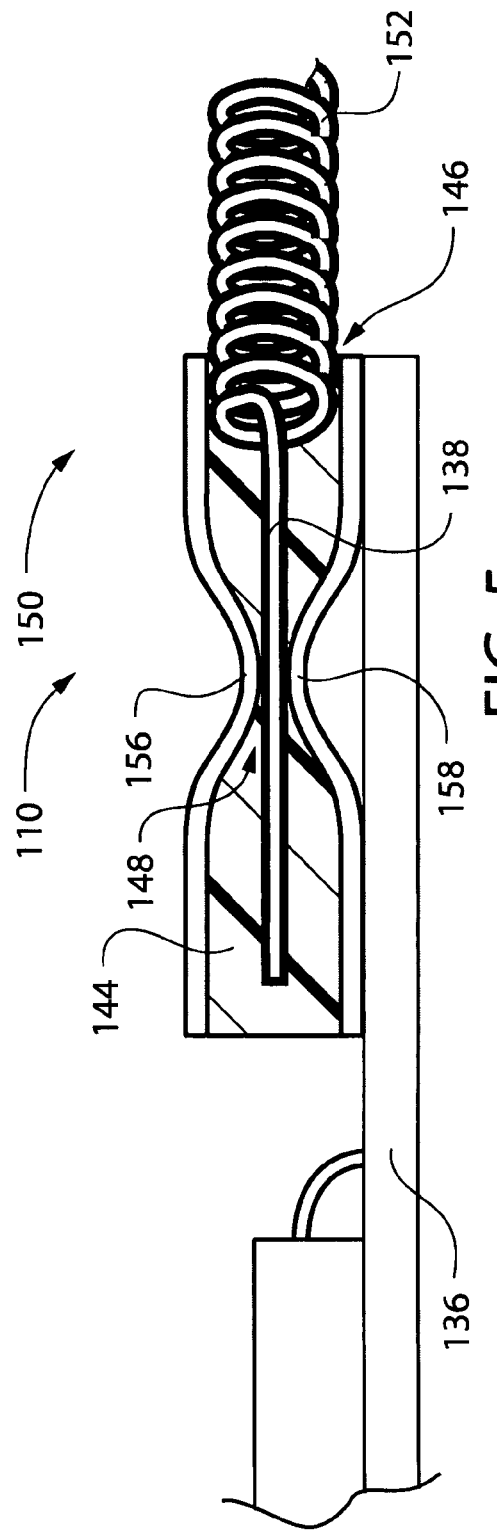

STRAIN-RESISTANT ELECTRICAL CONNECTION

TECHNICAL FIELD OF THE INVENTION

The present invention relates to a strain or fatigue-resistant electrical connection and a method of making the same. More specifically, the present invention provides for a connection between a lead and a circuit in a manner that makes the connection more resistant to fatigue failure caused by mechanical stresses such as movement or rotation of the lead relative to the circuit. In the present invention, a material is configured around the lead and near the point of connection to the circuit so as to create a region of decreasing flexibility or graduated stiffness near the point of connection. In certain embodiments, the lead may also be coiled or otherwise shaped to provide additional ability to accommodate mechanical strain without failure.

BACKGROUND OF THE INVENTION

Electrical circuits are used in a variety of environments that can present particular physical, chemical, and electrical factors for which the circuit must either be protected or be designed to endure. The present invention primarily concerns physical factors such as mechanical stress leading to fatigue, which in turn can cause a circuit malfunction by physically breaking or weakening a specific part of the circuit. A typical location for such malfunction is at or near the point of connection of a wire, lead, or other conductor to an electrical circuit. In circumstances where the wire and the connected-to circuit may move or rotate relative to one another, the wire may incur a concentration of mechanical stress and/or fatigue at or near the point of connection to the circuit. Mechanical stresses such as repeated bending or twisting, for example, can lead to a weakening of the wire until a break occurs.

FIGS. 1 and 2 provide examples of the problems addressed. In FIG. 1, lead 20 is connected to a printed circuit board 22 by a soldered connection 24. As lead 20 is twisted (as illustrated by arrow A), repeatedly bent (as illustrated by arrows B and C), or placed into tension or compression (arrow D), a concentration of stress occurs at or near the point of connection 24. Over time, as lead 20 is exposed to repeated mechanical cycles that provide for this concentration of stress, lead 20 may eventually weaken due to repeated deformation or cyclical movement. As a result, lead 20 will likely suffer a fatigue failure (or break) either at or near point of connection 26. Similarly, in FIG. 2, lead 20 is connected to printed circuit board 22 by a physical connector 28 that secures the connection of lead 20 by physically compressing or pinching lead 20 between crimping surfaces 30 and 32. Again, as lead 20 is subjected to a variety of forces as illustrated by arrows A, B, C, and D, lead 20 may weaken and eventually break due to repeated deformations at or near point of connection 34. An electrical connection more resistant to various forces and less likely to undergo fatigue failure is desirable.

SUMMARY

Various features and advantages of the invention will be set forth in part in the following description, or may be apparent from the description.

The present invention provides an electrical connection, and a method of creating such connection, that is resistant to mechanical stresses that can occur when a wire or lead is twisted or caused to bend repeatedly about its connection to a circuit. Generally speaking, with the present invention a material is provided that surrounds the lead near the point of connection to the circuit so as to create a region of decreasing flexibility or graduated stiffness near the point of connection. The material is selected and configured with the lead so that it will at least partially distribute some of the mechanical stress created by movement or twisting of the lead relative to a substrate or other surface carrying the circuit to which the lead is connected. By providing a region of graduated stiffness/decreasing flexibility near the location of the connection to the circuit, the concentration of stress in the lead at the point of connection to the circuit is minimized (or even avoided) through a greater distribution of the stress over the end of the lead and into the surrounding material. As such, a more robust connection to certain mechanical stresses is realized. In certain embodiments, the lead may also be coiled or otherwise shaped to provide an additional ability to absorb and dissipate mechanical forces. A variety of materials may be used to create the region of graduated stiffness about the lead, and some representative examples are provided herein. Selected exemplary embodiments and methods, including preferred, of the present invention are here summarized by way of explanation of the invention and not limitation of the invention.

In one exemplary method of the present invention, a process for creating a fatigue-resistant electrical connection is provided in which an electrical conductor having at least one end is configured for connecting to an electrical circuit. A predetermined length of the electrical conductor proximate such end is positioned within a distributor. The distributor is configured for distributing stress over a predetermined length of the electrical conductor. The distributor is attached to a support surface, such as a printed circuit board for example, that is stationary relative to the electrical circuit. The distributor can be attached in a variety of ways including adhesion, bonding, or a mechanical connection. The end of the electrical conductor is connected to the electrical circuit. Such connection may include soldering or a mechanical connection such as a crimp. Preferably, although not required, the electrical conductor is adhered to the distributor along the predetermined length of the conductor that is positioned within the distributor. The distributor is constructed from a material capable of distributing stress along the predetermined length of the conductor, preferably a resilient material. While a variety of resilient materials might be employed, some examples include rubbers or other elastomeric materials. To further enhance the stress-resistance of the circuit, the conductor may be constructed from a wire that is coiled or otherwise shaped in a manner that helps distribute stress. Where necessary, the conductor may be coated with an insulating material to prevent conduction through the distributor.

In another exemplary method of the present invention, a process for assembling a strain-resistant electrical connection to an electrical circuit is provided. The process includes providing a resilient material capable of distributing mechanical forces. A portion of an electrical conductor proximate to one of its ends, referred to as a first end, is positioned within the resilient material. The resilient material is attached to a support, which may be a printed circuit board or otherwise. The first end of the electrical conductor is connected to the electrical circuit in a manner that fixes the position of the first end relative to the support. As such, the resilient material provides a transition zone for the electrical conductor in which the flexibility of the electrical conductor decreases along a direction from the point of entry of the conductor into the resilient material towards the point of connection of the first end to the electrical circuit.

The present invention also provides embodiments of a stress-resistant electrical connection. In one exemplary embodiment of the present invention, a durable connection for an electrical circuit is provided that includes a substrate supporting at least a portion of the electrical circuit. A conductor is included that has at least one connecting end attached to the electrical circuit. A resilient material is positioned proximate to the connecting end and surrounds a predetermined portion of the conductor. The resilient material is attached to the substrate and is configured for gradually restricting the mobility of the conductor along the end in a direction moving along the conductor and towards the electrical circuit.

In another exemplary embodiment, the present invention provides a strain-resistant electrical connection to an electrical circuit that includes a material for distributing stress. A wire is provided having a first end; a portion of the conductor near the first end is embedded within the material for distributing stress. This embodiment includes a wire-connector that is in electrical communication with the circuit. The wire connector encloses at least a portion of the stress distributing material and physically contacts and restrains the wire at a location proximate to its first end so as to provide an electrical connection. The material for distributing stress is attached to a support surface that is substantially immovable relative to the circuit. The material for distributing stress is configured to provide a zone of graduated stiffness about the wire at a location proximate to the first end.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 5 illustrates another exemplary embodiment of the present invention.

Figure 1:
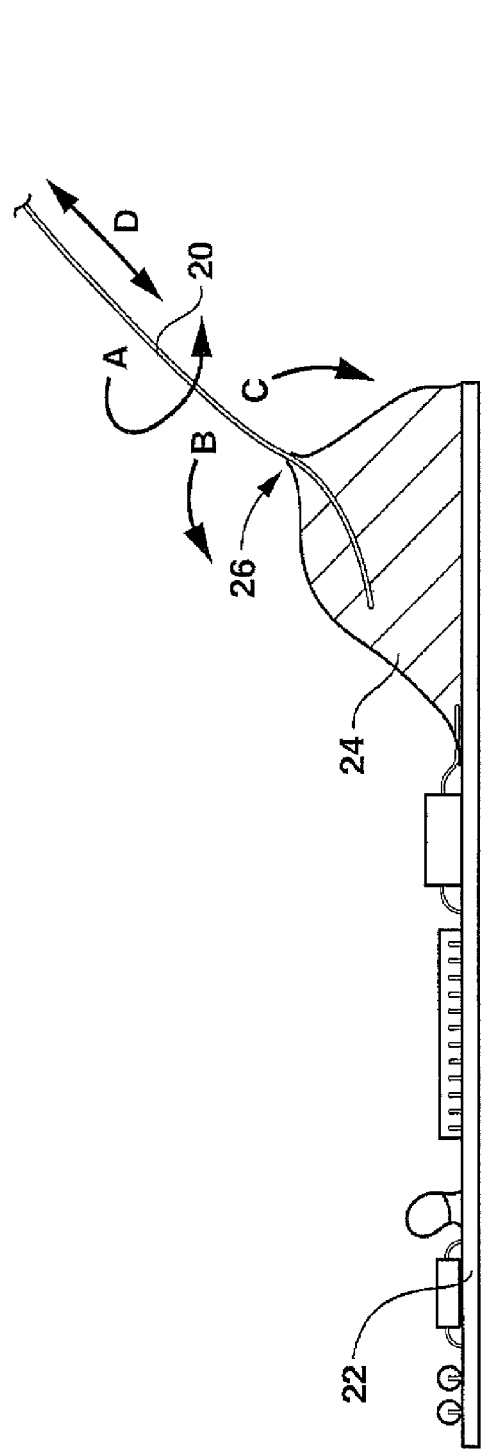
FIG. 1 illustrates an example of an electrical connection in which a lead is soldered to a printed circuit board.

Repeat use of reference characters throughout the present specification and appended drawings is intended to represent same or analogous features or elements of the invention.

DETAILED DESCRIPTION OF PREFERRED EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

Figure 3A:
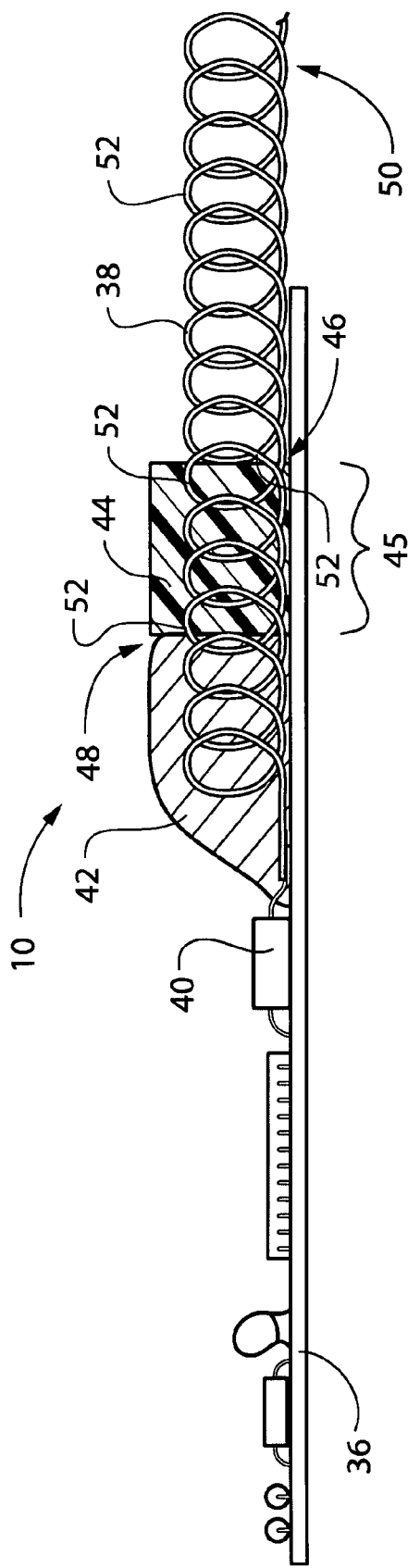
FIG. 3 illustrates an exemplary embodiment of the present invention.
Figure 3B:
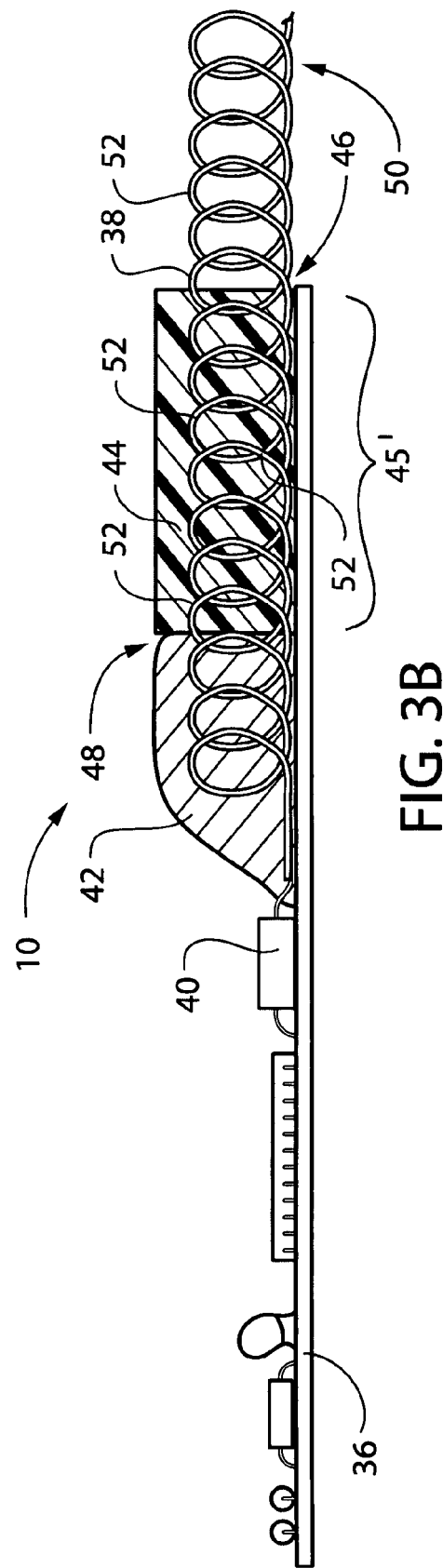

FIGS. 3A through 3C provide illustrations of three exemplary embodiments of an electrical connection 10 according to the present invention. A printed circuit board 36 is shown as might be found in any electronics. For this particular example, a wire or other electrical lead 38 is connected to a component 40 on board 36. While a number of connections may be used with the present invention, FIG. 3 illustrates a soldered connection 42 between lead 38 and component 40 of board 36. Printed circuit board 36 is used to illustrate this particular exemplary embodiment; the present invention is not limited to use with only a circuit board.

Adjacent to connection 42 is a distributor 44 that is attached to board 36. Lead 38 is embedded within distributor 44 to create a transition zone 45 (FIG. 3A), 45' (FIG. 3B), and 45" (FIG. 3C) along lead 38 through the length of distributor 44. More specifically, along transition zone 45, 45' or 45", the mobility or flexibility of lead 38 decreases along the direction from entry point 46 (where lead 38 enters distributor 44) to the point of connection 48 (where lead 38 enters soldered connection 42). Stated alternatively, lead 38 experiences increasing stiffness through transition zone 45 along the direction from entry point 46 to point of connection 48. By gradually decreasing the mobility of lead 38 along transition zone 45, the stress to lead 38 is distributed throughout its length in transition zone 45 instead of concentrating the stress in a particular location such as point of connection 48. As a result, the local strain on lead 38 is reduced or eliminated at or near the point of connection 48, and the likelihood of a breaking or weakening the connection at point 48 is also decreased or removed.

Figure 2:
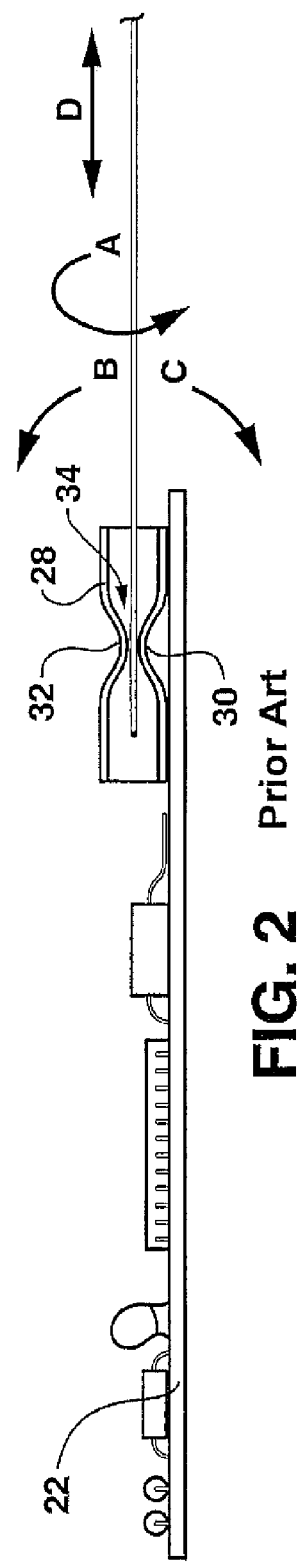
FIG. 2 illustrates an example of an electrical connection in which a lead is mechanically connected to a printed circuit board.

This transition zone 45, 45', or 45" of decreasing flexibility for lead 38 is achieved in part by the material selected for distributor 44. Preferably, distributor 44 is constructed from a resilient material capable of reducing the local strain on lead 38 that is caused whenever lead 38 is subjected to the forces described with regard to FIGS. 1 and 2. By way of examples only, such resilient material could be a rubber or another elastomeric material having suitable properties. Using the teachings disclosed herein, one of ordinary skill in the art will understand that a variety of materials can be used for distributor 44.

Stress resistance can be further enhanced through the geometry or shape used for lead 38. For the exemplary embodiment illustrated in FIG. 3, lead 38 is shown as a coiled electrical conductor or wire. By providing lead 38 with a series of coils 52, the ability of connection 10 to withstand the mechanical forces applied to the non-embedded portion 50 of lead 38 is further increased. Specifically, coils 52 can contract, expand, or rotate so as to further reduce the concentration of stress at a given point. Although shown as helical, lead 38 could also be provided with other shapes, such as sinusoidal, in order to improve the resistance to stress. In addition, lead 38 may be constructed from a material that increases the resiliency of connection 10. By way of example only, conductive polymer compounds, steel, spring steel, and spring steel coated with brass have been found by applicants to provide for a conductive and yet resilient lead 38. However, numerous other materials and shapes may be utilized as one of ordinary skill in the art will understand using the teachings disclosed herein. Additionally, in the event the material used for distributor 44 is conductive or otherwise negatively affects the conduction of lead 38, a nonconductive coating can be included around lead 38. By way of example only, such coating could be provided by using a nonconductive rubber with little or no carbon black present.

Referring again to the exemplary embodiment of FIGS. 3A through 3C, the ability to withstand mechanical stress can be further enhanced by physically attaching or adhering lead 38 to distributor 44. As such, the ability of distributor 44 to distribute stress is enhanced because the movement of lead 38 relative to board 36 will be more efficiently restrained by distributor 44. A variety of techniques can be used to provide this attachment. For example, lead 38 can be first provided with a coating of non-conductive rubber that can be bonded to both the material of lead 38 and the material of distributor 44 by a curing step. By way of further example, an adhesive may be used for attachment.

As shown in FIGS. 3A through 3C, the relative length of lead 38 that is incorporated into distributor 44 may also be varied in order increase the resistance to mechanical stress. For example, as compared with FIG. 3A, transition zone 45' in FIG. 3B is longer such that more of lead 38 and its coils 52 are contained within distributor 44. As such, transition zone 45' provides an increased length over which the stresses created by forces acting on lead 38 may be distributed. As shown in FIG. 3C, additional length may also be added to create transition zone 45" in which a portion of distributor 44 is not attached to board 36. Such a configuration would also provide additional length over which to distribute mechanical forces and reduce stress while also adding additional flexibility over the length of transition zone 45".

Figure 4:
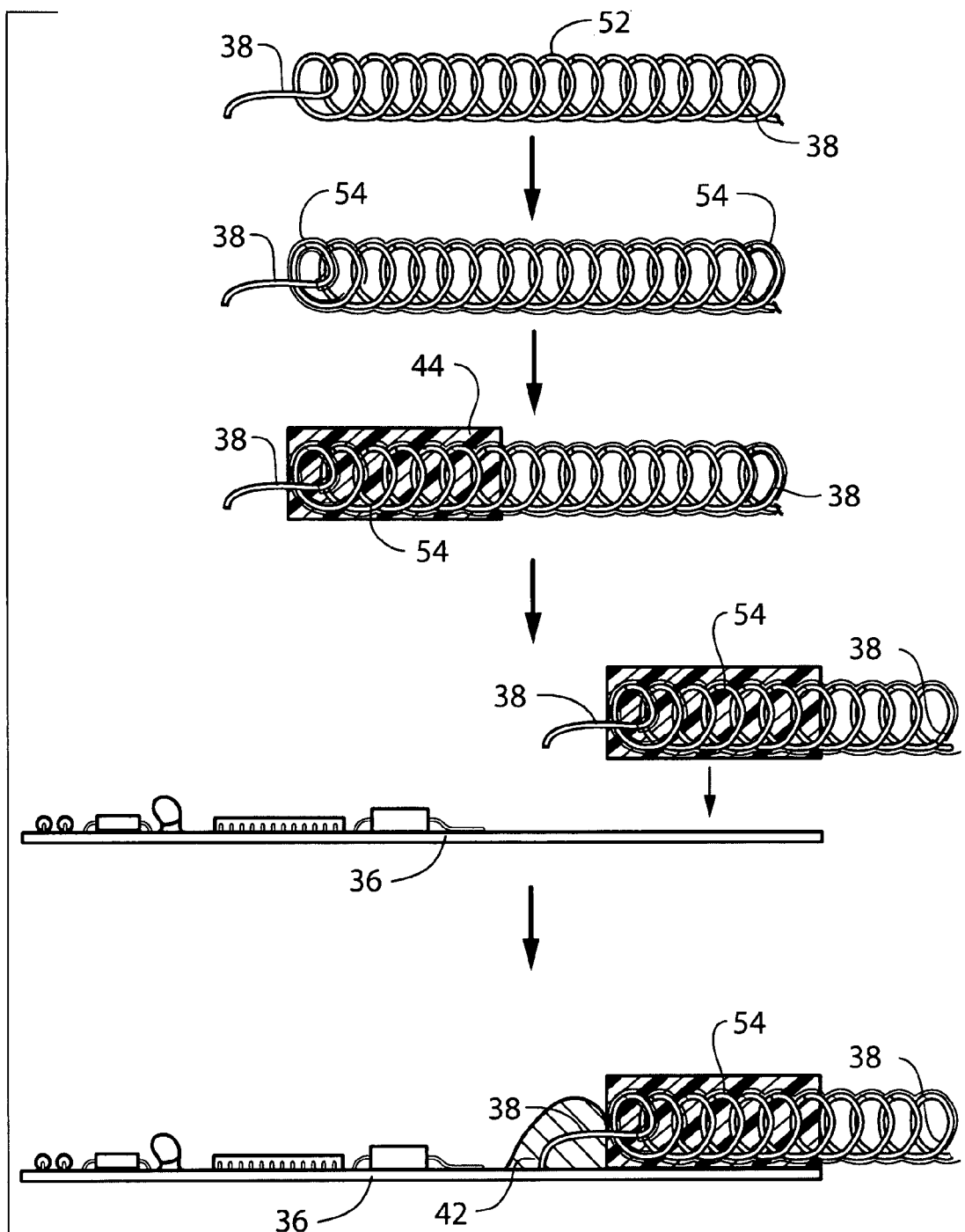
FIG. 4 illustrates an exemplary method according to the present invention.

The present invention also includes method of manufacturing a stress-resistant electrical connection. FIG. 4 illustrates certain steps of an exemplary method for manufacturing one exemplary embodiment of the present invention. Starting with the top of the illustrations in FIG. 4, where necessary, lead 38 is coated with a nonconductive coating 54 such as a nonconductive rubber compound. For example, it may be desirable to provide a nonconductive coating on lead 38 to prevent current degradation.

Additionally, as previously discussed, lead 38 may be attached or bonded to distributor 44 to increase the dissipation efficiency of distributor 44. As such, coating 54 may be selected from materials that will bond with distributor 44 or an additional adhesive coating may be applied to lead 38 or coating 54. A variety of techniques may be used to accomplish the step of coating lead 38. By way of example, lead 38 may be dipped into or sprayed with coating 54.

Next, coated lead 38 is embedded within a resilient or energy absorbing material to create distributor 44. Exemplary techniques for this embedding include molding the material of distributor 44 around coated lead 38. Alternatively, coated lead 38 could be dipped into the resilient material that forms distributor 44 until the desired thickness is obtained. A variety of other techniques may be used as will be understood by one of ordinary skill in the art using the teaching disclosed herein.

Where a coating 54 is used on lead 38 for bonding to distributor 44, an additional step may be used to create the bonding effect. For example, depending upon the chemical properties of coating 54, a curing step may be necessary to bond coating 54 to the material of distributor 44. As such, the embedded lead 38 and distributor 44 composite may be subjected to heat and/or pressure to bond these materials together. Alternatively, coating 54 may be selected so that it automatically adheres to distributor 44 upon the embedding of lead 38 therein.

Distributor 44 with embedded lead 38 is then attached to printed circuit board 36 or some surface that will be relatively non-movable with respect to connection 42. This step may be accomplished mechanically, or an adhesive may be used to glue distributor 44 to board 36. Alternatively, depending upon the materials used for distributor 44 and board 36, a curing step of applying heat and/or pressure may be used to provide the attachment. One of ordinary skill in the art will understand, using the teachings disclosed herein, that numerous techniques may be used to attach distributor 44 to board 36.

Lead 38 is electrically connected to board 36. For the exemplary embodiment of FIG. 4, this connection is shown as a soldered connection 42. However, numerous other methods may be used to provide this electrical connection. By way of example only, numerous mechanical connectors are available that can provide a secure electrical connection of lead 38 to board 36 next to distributor 44.

FIG. 5 illustrates another exemplary embodiment of the electrical connection 110. Here, lead 138 is electrically connected to printed circuit board 136 by way of a mechanical connection. More specifically, a pair of crimping jaws 156 and 158 pinch lead 138 are used to create an electrical and physical connection. One of ordinary skill in the art will appreciate using the teachings disclosed herein that numerous configurations for mechanically connecting lead 138 may be used with the present invention.

As show in FIG. 5, lead 138 is embedded within a material that serves as a distributor 144 of mechanical forces applied to the non-embedded portion 150 of lead 138. Lead 138 enters distributor 144 at point 146 and is physically constrained and electrically connected at point 148. Additionally, distributor 144 is immovable with respect to board 136. As a result, the flexibility of lead 138 decreases from point 146 to point 148. As lead 138 is subjected to mechanical forces and/or movement, distributor 144 functions to distribute the effect of those forces would otherwise have at the point of connection 148 and thereby functions to reduce a stress concentration that would otherwise occur. As with the exemplary embodiment of FIG. 3, a series of coils 152 or other features may be provided with lead 138 to further enhance the ability of connection 110 to withstand mechanical stress. Using the teachings disclosed herein, one of ordinary skill in the art will understand that other embodiments of the present invention may be used without coils 152 while still realizing the stress reducing advantages of the present invention.

As previously discussed, lead 138 may be provided with a nonconductive coating to prevent the loss of current through distributor 144. Additionally, the surface of lead 138 can be attached to distributor 144 to more efficiently distribute stress throughout lead 138. The connection of distributor 144 to board 136 and the connection of lead 138 to distributor 144 may be accomplished through the application of coatings that are subsequently cured as previously discussed.

Using the teachings disclosed herein, one of ordinary skill in the art will appreciate that other embodiments of the present invention exist that fall under the scope of the appended claims. In fact, it should be appreciated by those skilled in the art that modifications and variations can be made to the connection and method as described herein, without departing from the scope and spirit of the claims. It is intended that the invention include such modifications and variations as come within the scope of the appended claims and their equivalents.

What is claimed is:

1. A durable connection for an electrical circuit, comprising:
 a circuit board comprising at least part of the electrical circuit;
 a stress distributor attached to said circuit board, said stress distributor comprising an elastomeric material of a predetermined length; said stress distributor having multiple sides and being attached to said circuit board along only one of said sides; and an electrical conductor having an end that is connected to the electrical circuit, the end being located outside of said stress distributor and adjacent to said stress distributor;

wherein at least a portion of said electrical conductor is contained along the length of said stress distributor.

2. A durable connection for an electrical circuit as in claim 1, wherein stress distributor is bonded to at least a portion of said electrical conductor.

3. A durable connection for an electrical circuit as in claim 1, wherein said electrical conductor comprises a coiled wire.

4. A durable connection for an electrical circuit as in claim 1, wherein said elastomeric material comprises rubber.

5. A durable connection for an electrical circuit as in claim 1, wherein said electrical conductor comprises a coiled spring connector constructed from a brass-coated steel.

6. A durable connection for an electrical circuit as in claim 1, further comprising a non-conductive coating located upon said electrical conductor so as to insulate said electrical conductor from said stress distributor.

7. A durable connection for an electrical circuit as in claim 6, wherein said non-conductive coating is bonded to said stress distributor.

8. A durable connection for an electrical circuit, comprising:

a substrate supporting the electrical circuit along a first side of said substrate;

an electrical conductor having at least one end that is electrically connected to the electrical circuit and physically attached to said substrate so as to be non-movable with respect to said substrate; and a stress-distributing material comprising an elastomeric material of a predetermined length, said stress distributing material attached only to the first side of said substrate and to said electrical conductor;

wherein at least a portion of said electrical conductor is contained along the length of said stress-distributing material.

9. A durable connection for an electrical circuit as in claim 8, wherein said electrical conductor comprises a coiled wire.

10. A durable connection for an electrical circuit as in claim 8, wherein said substrate comprises a printed circuit board that includes at least a portion of the electrical circuit.

11. A durable connection for an electrical circuit as in claim 8, wherein said stress-distributing material is comprised of rubber.

12. A durable connection for an electrical circuit as in claim 8, wherein said electrical conductor comprises a coiled spring connector constructed from a brass-coated steel.

13. A durable connection for an electrical circuit as in claim 8, wherein said electrical conductor is bonded to said stress-distributing material.

14. A durable connection for an electrical circuit as in claim 8, further comprising a non-conductive coating located upon said electrical conductor so as to insulate said electrical conductor from said stress-distributing material.

15. A durable connection for an electrical circuit as in claim 14, wherein said non-conductive coating is bonded to said stress-distributing material.

* * * * *